(12) United States Patent
Man et al.

(10) Patent No.: US 8,007,871 B2
(45) Date of Patent: Aug. 30, 2011

(54) ELECTROSPRAY DEPOSITION: DEVICES AND METHODS THEREOF

(75) Inventors: Piu Francis Man, Wilmington, DE (US); Salvatore J. Pace, Newark, DE (US)

(73) Assignee: NanoSelect, Inc., Wilmington, DE (US)

( * ) Notice: Subject to any disclaimer, the term of this patent is extended or adjusted under 35 U.S.C. 154(b) by 76 days.

(21) Appl. No.: 12/161,301

(22) PCT Filed: Jan. 26, 2007
(Under 37 CFR 1.47)

(86) PCT No.: PCT/US2007/002280
§ 371 (c)(1),
(2), (4) Date: Feb. 11, 2009

(87) PCT Pub. No.: WO2007/089650
PCT Pub. Date: Aug. 9, 2007

(65) Prior Publication Data
US 2010/0068406 A1    Mar. 18, 2010

Related U.S. Application Data

(60) Provisional application No. 60/762,613, filed on Jan. 26, 2006.

(51) Int. Cl.
*B05D 1/04* (2006.01)
*B05D 3/06* (2006.01)
*C23C 16/00* (2006.01)

(52) U.S. Cl. ......... 427/457; 427/533; 427/553; 118/627

(58) Field of Classification Search ............ 427/457, 427/533, 553; 118/627
See application file for complete search history.

(56) References Cited

U.S. PATENT DOCUMENTS

| 6,350,609 B1 | 2/2002 | Morozov et al. |
| 2005/0123688 A1 | 6/2005 | Craighead |
| 2005/0191417 A1 | 9/2005 | Fan et al. |
| 2007/0034156 A1* | 2/2007 | Ratner et al. ............. 118/723 FI |

OTHER PUBLICATIONS

Jayasinghe, et al., "An Advanced Jet-Based Approach to Processing Nanotubes", Physica E-Low-Dimension Systems and Nanostructures, Nov. 2005, 31(1), 17-26, XP005232585.
O'Shea, J. N. et al., "Electrospray Deposition of Carbon Nanotubes in Vacuum", Nanotechnology, 2007, 18(3), 35707.
Morozov, V.N. et al., "Electrospray Deposition as a Method to Fabricate Functionally Active Protein Films", Anal. Chem., 1999, 71, 1415-1420.
Avseenko, N.V. et al., "Immobilization of Proteins in Immunochemical Microarrays Fabricated by Electrospray Deposition", Anal. Chem., 2001, 73, 6047-6052.
Avseenko, N.V. et al., "Immunoassay with Multicomponent Protein Microarrays Fabricated by Electrospray Deposition" Anal. Chem., 2002, 74, 927-933.
Lee, B. et al., "Fabrication of Protein Microarrays for Immunoassay Using the Electrospray Deposition (ESD) Method" Journal of Chemical Engineering of Japan, 2003, 36(11), 1370-1375.
Morozov, V.N. et al., "Electrospray Deposition as a Method to Fabricate Functionally Active Protein Films", Anal. Chem., 1999, 71, 3110-3117.

* cited by examiner

*Primary Examiner* — Frederick J Parker
(74) *Attorney, Agent, or Firm* — Woodcock Washburn, LLP

(57) ABSTRACT

Disclosed herein are apparatus and methods for selectively depositing molecular ions on nanoscale substrates such as carbon nanotube arrays using electrospray ionization.

34 Claims, 15 Drawing Sheets

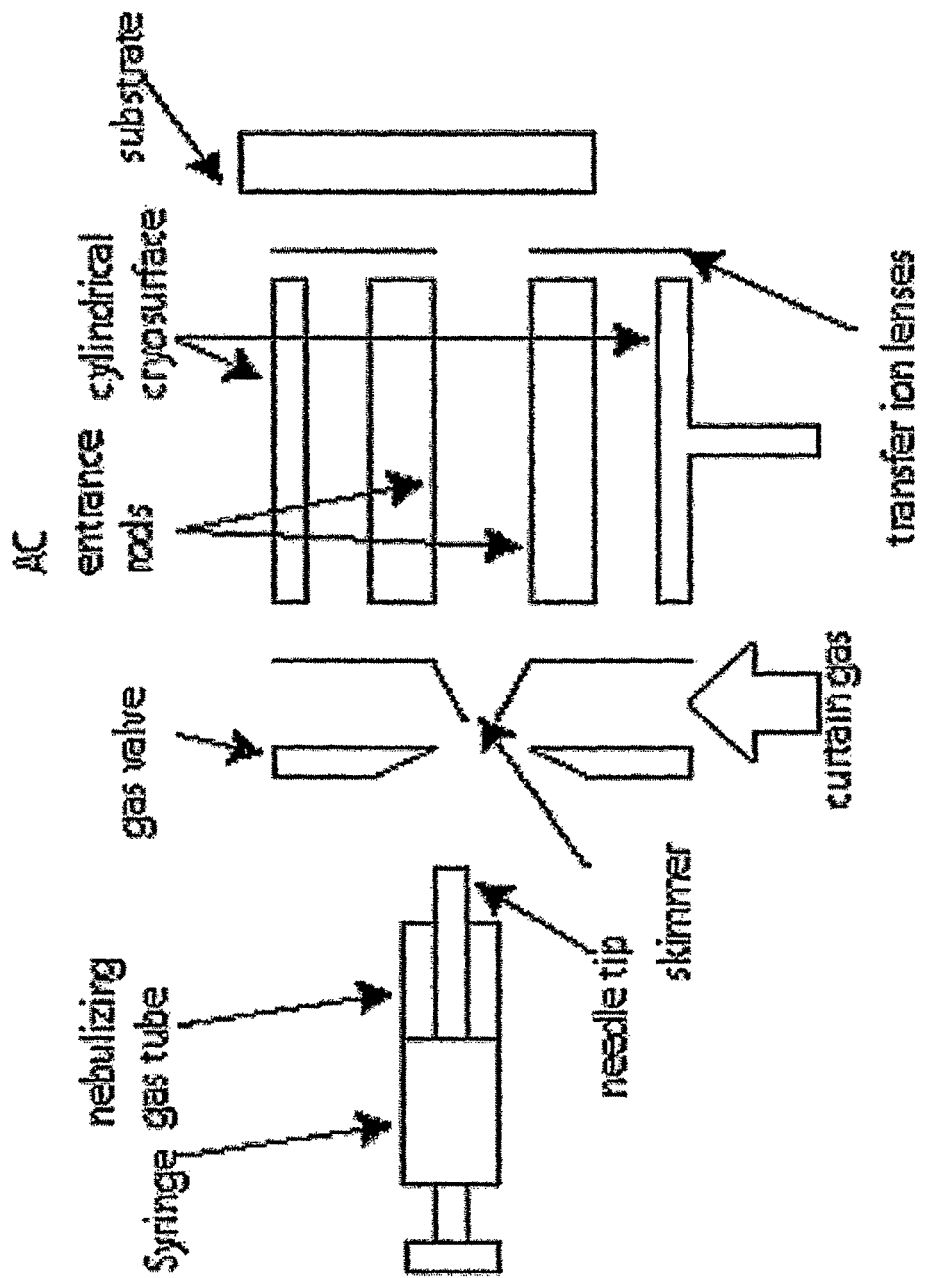
Fig. 1 shows a schematic of an ion source.

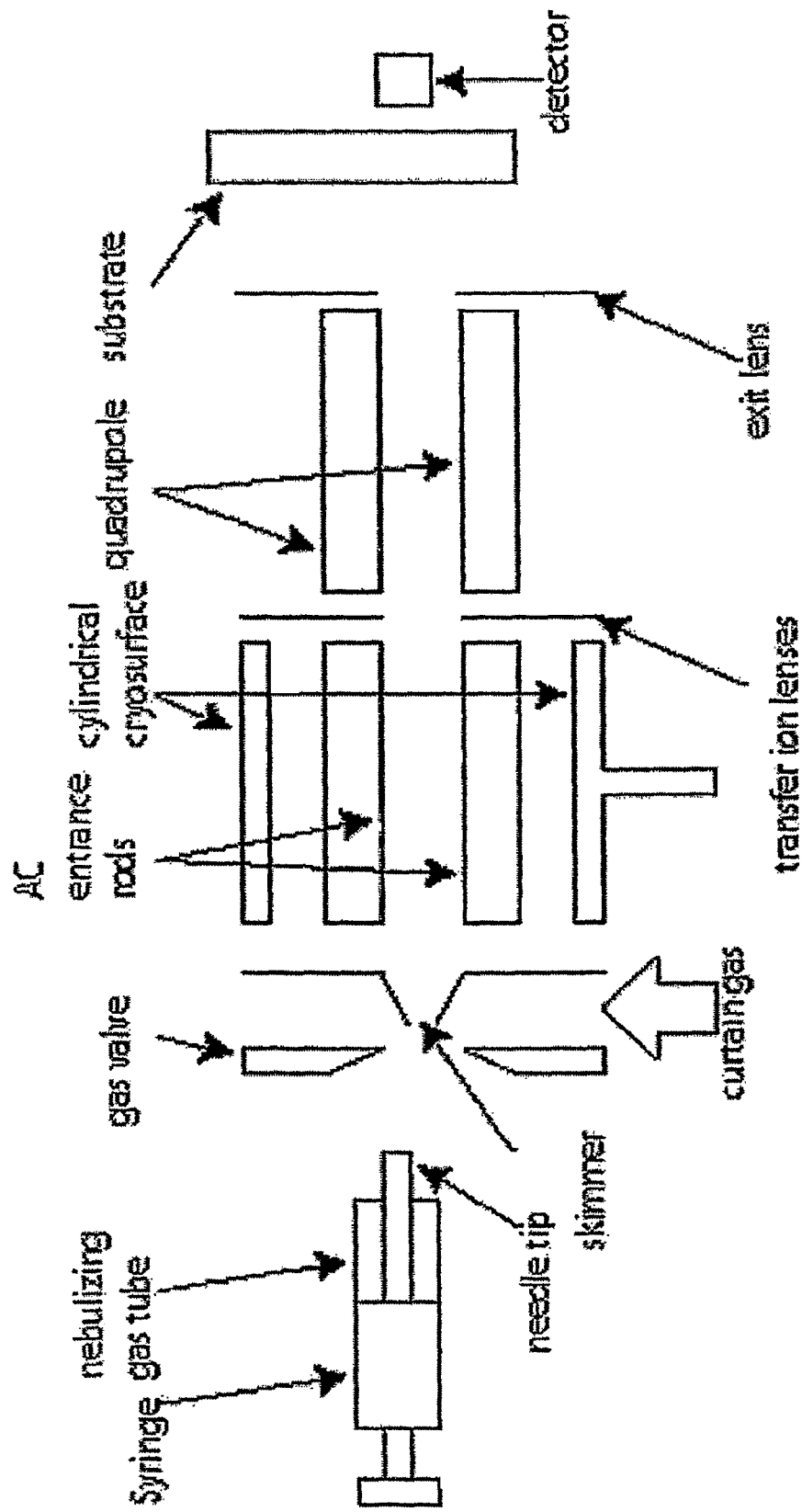
Fig. 2 shows a schematic of an ion source with an ion detector.

Fig. 3 shows a schematic of an ion beam direct write deposition system
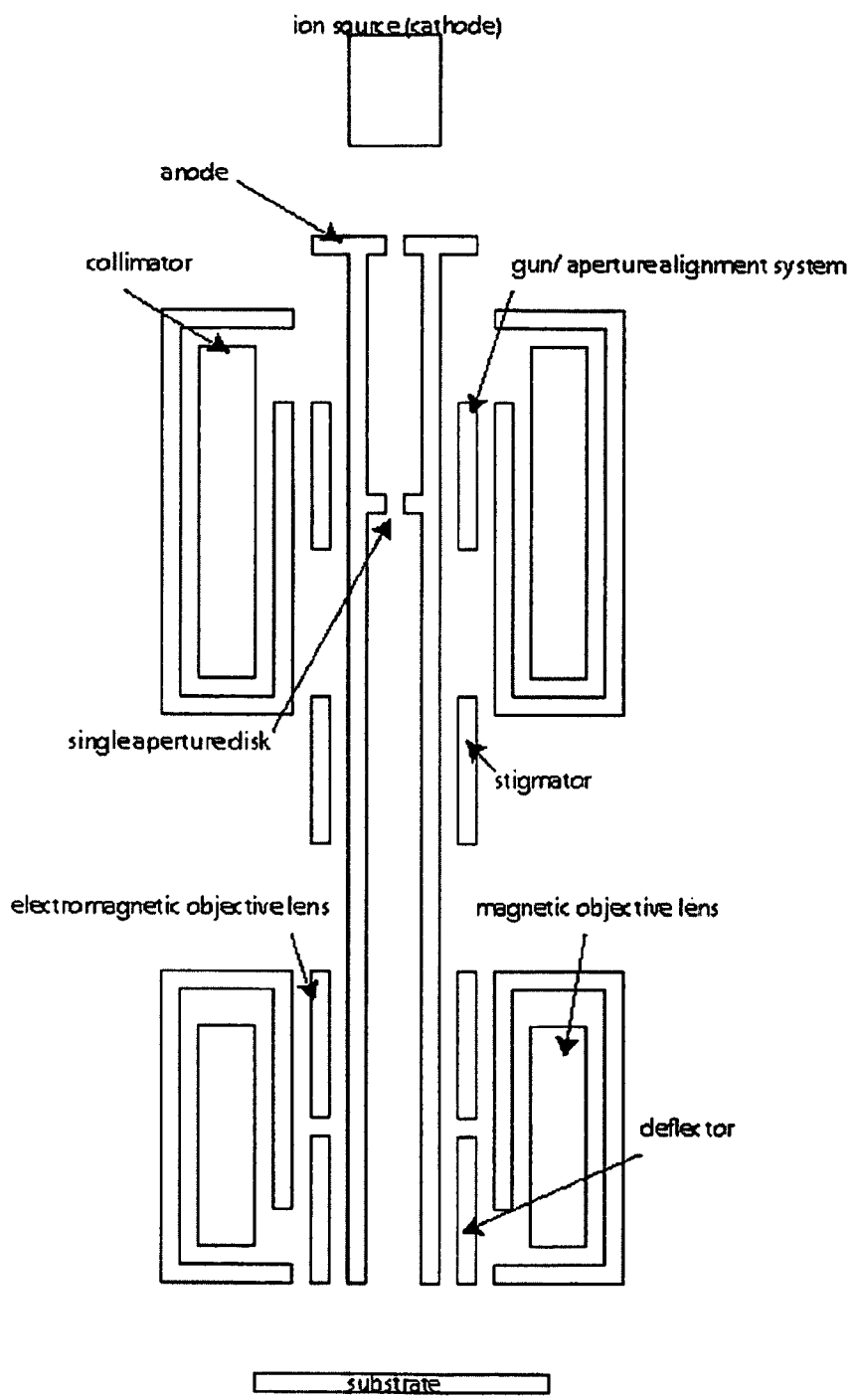

Fig. 4 shows the gun/aperture alignment module
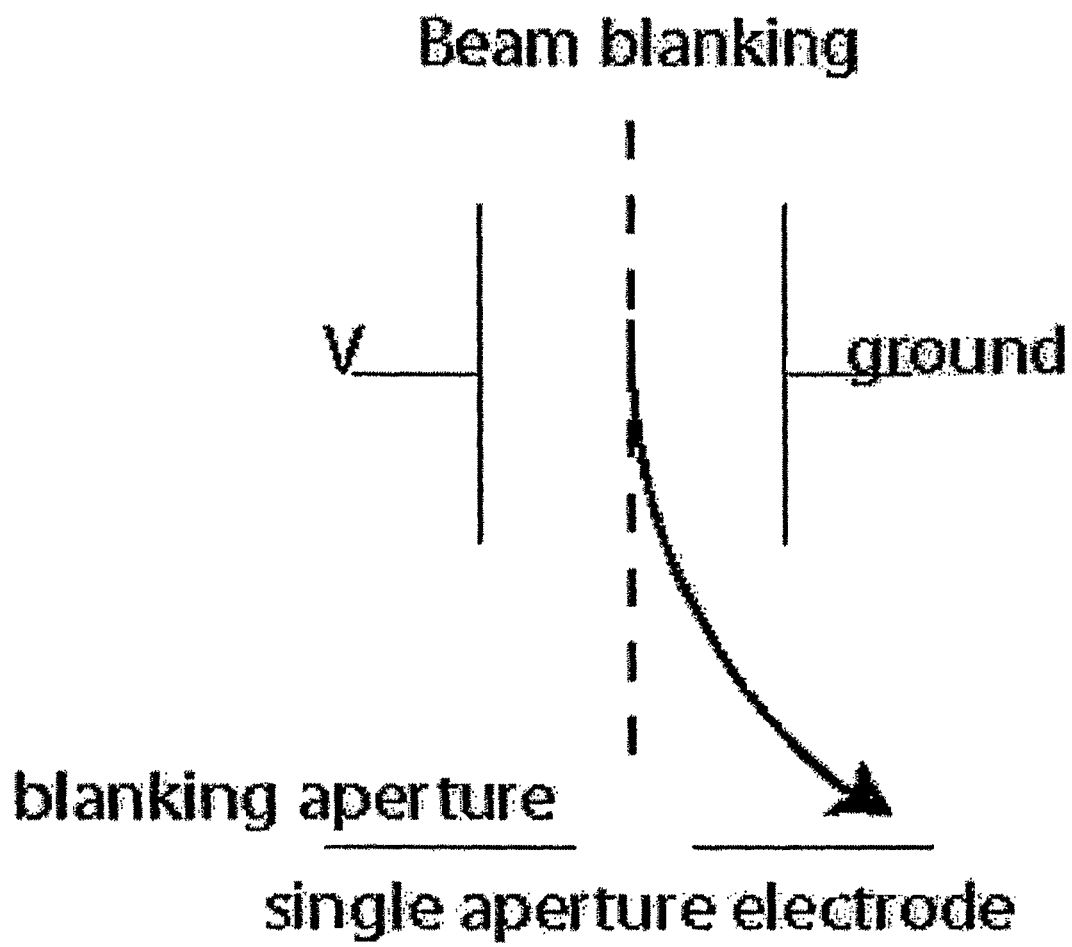

Fig 5 shows a drawing of a collimator
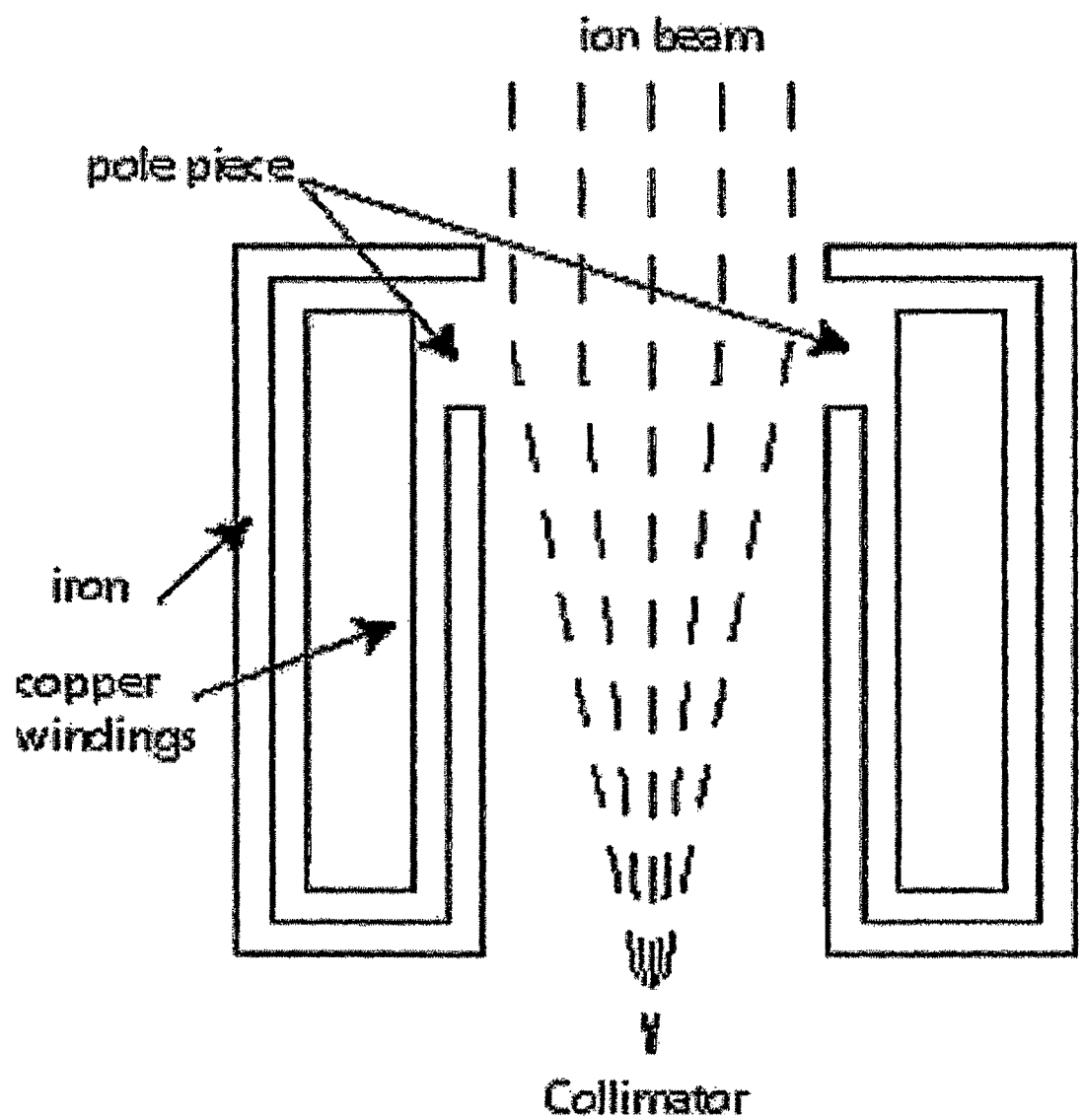

Fig. 6 shows a cross section of a magnetic octupole
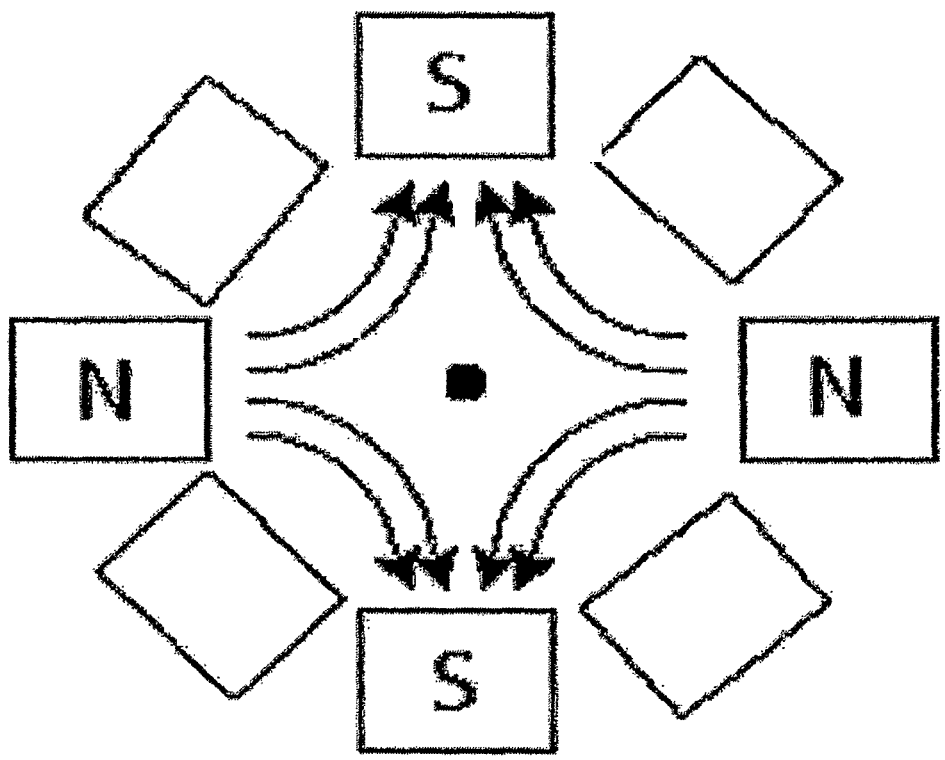

Fig. 7 shows the electrostatic objective lens
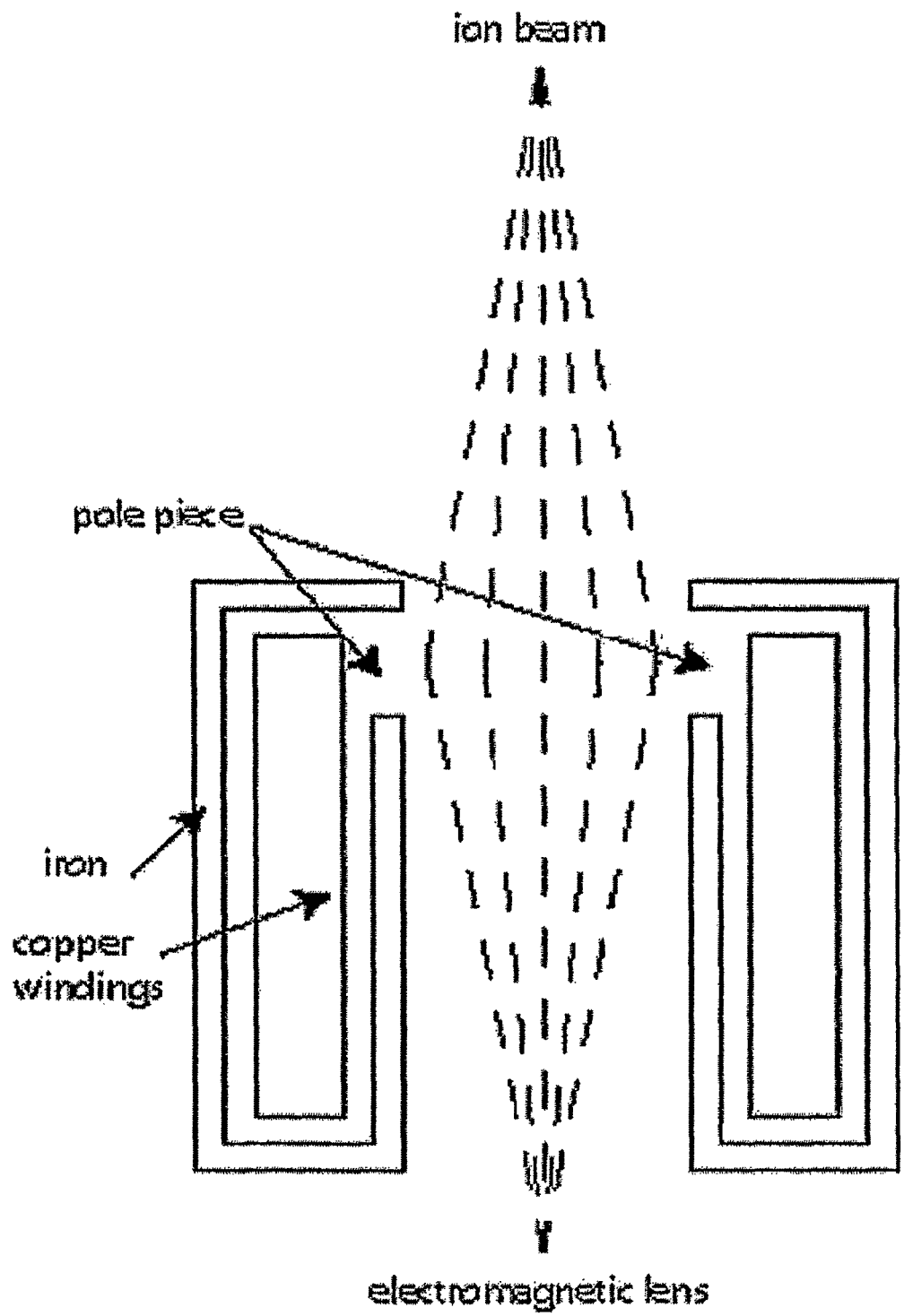

Fig. 8 shows the magnetic objective lens
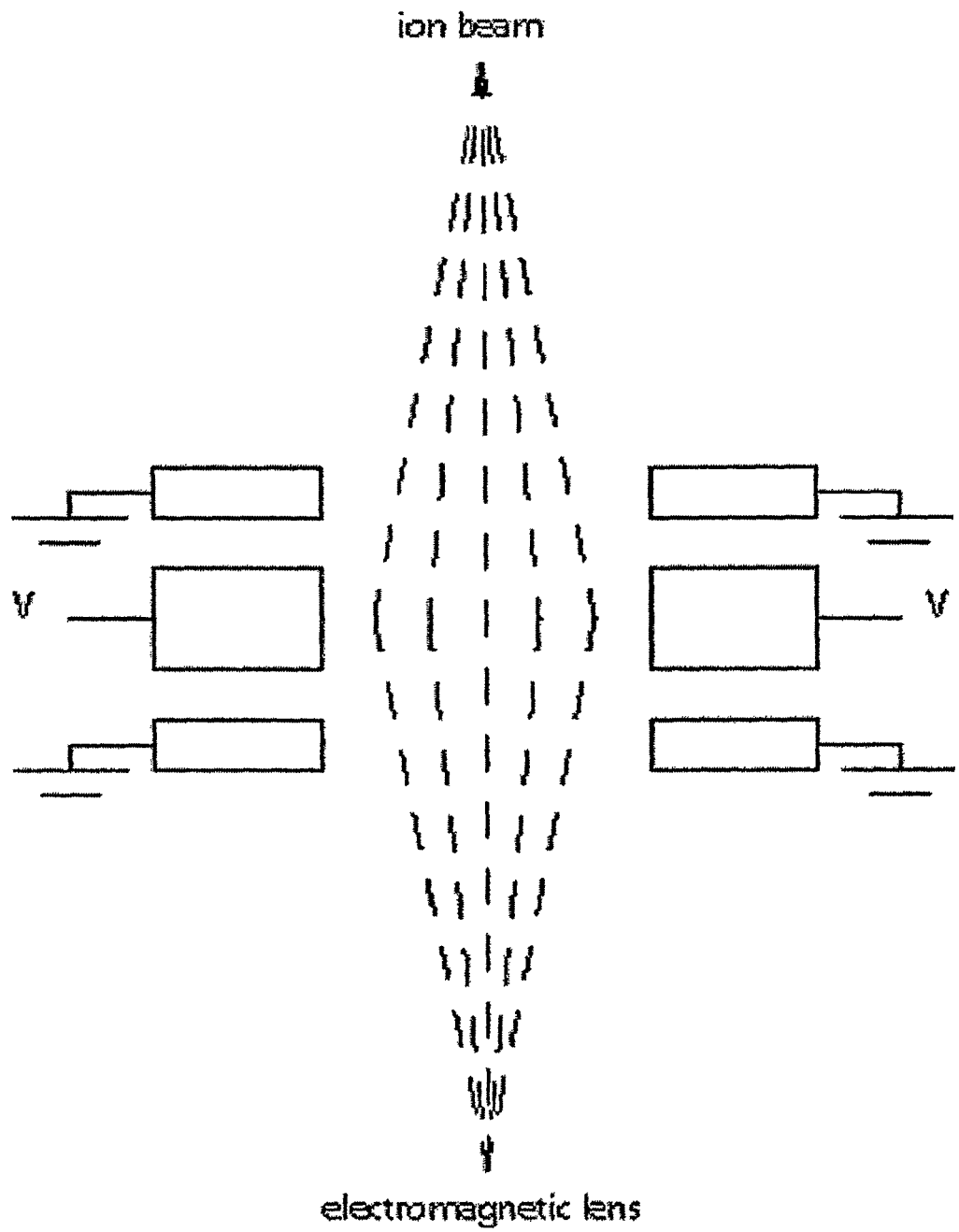

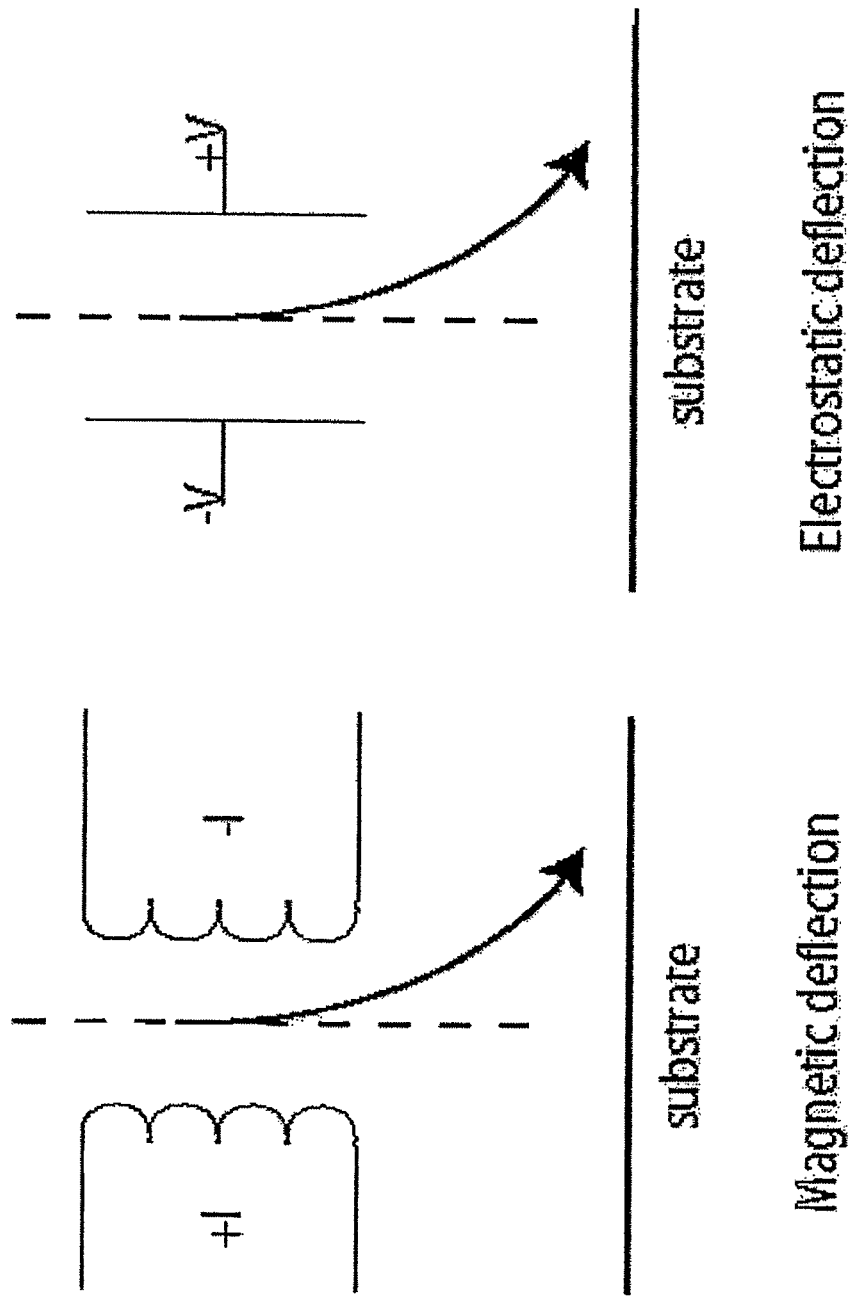
Fig. 9 shows the concept of beam deflection magnetically and electrostatically

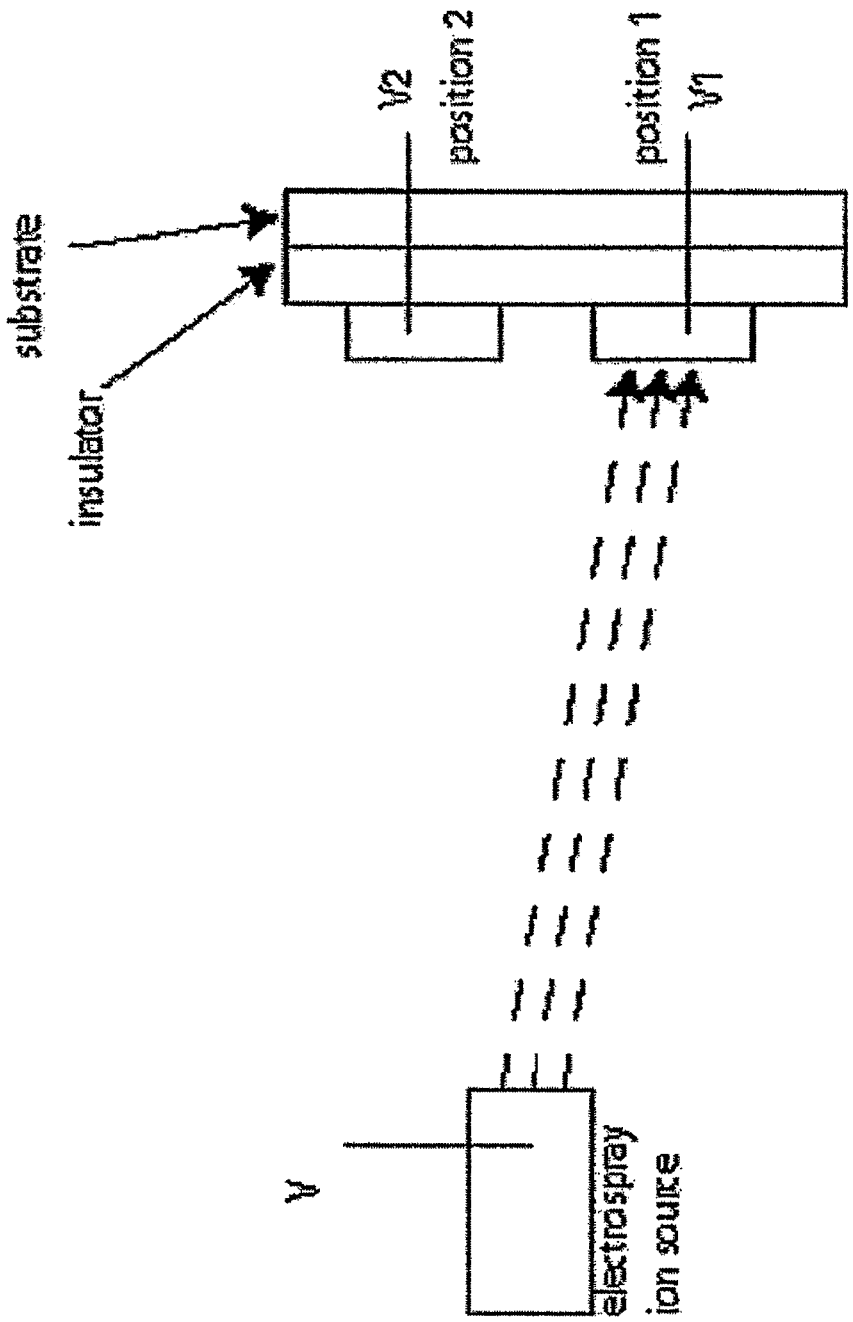
Fig. 10 shows an ion selective deposition method using voltage scheme Fig. 11 shows a typical setup for electrospray
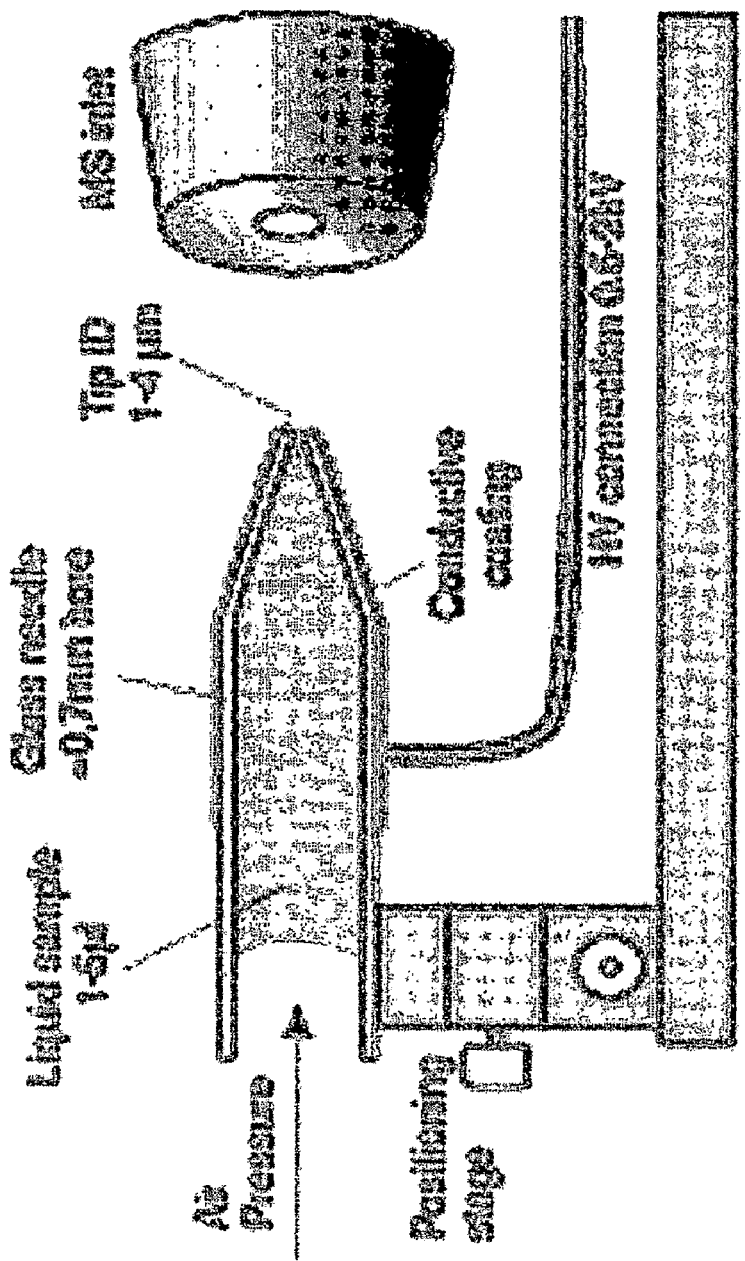

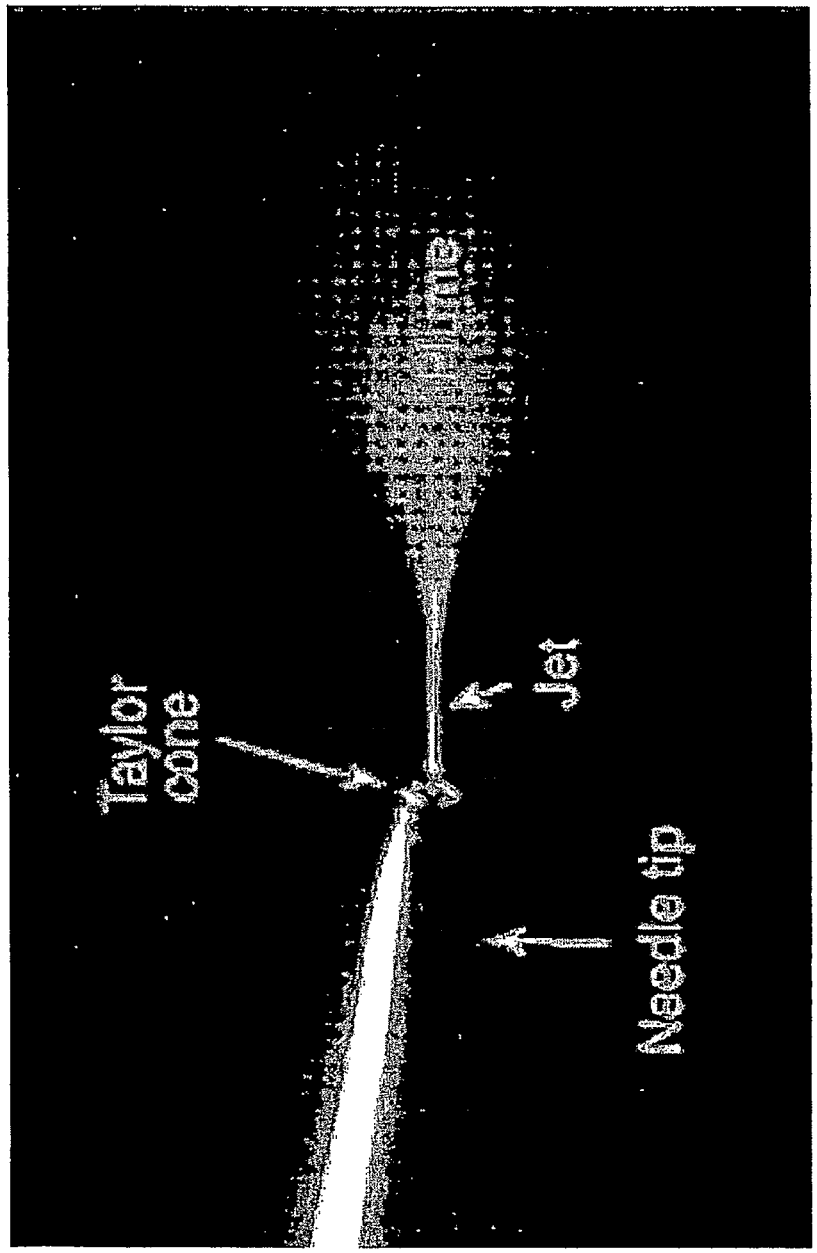
Fig. 12 illustrates the production of the spray of ions at the tip of the needle.

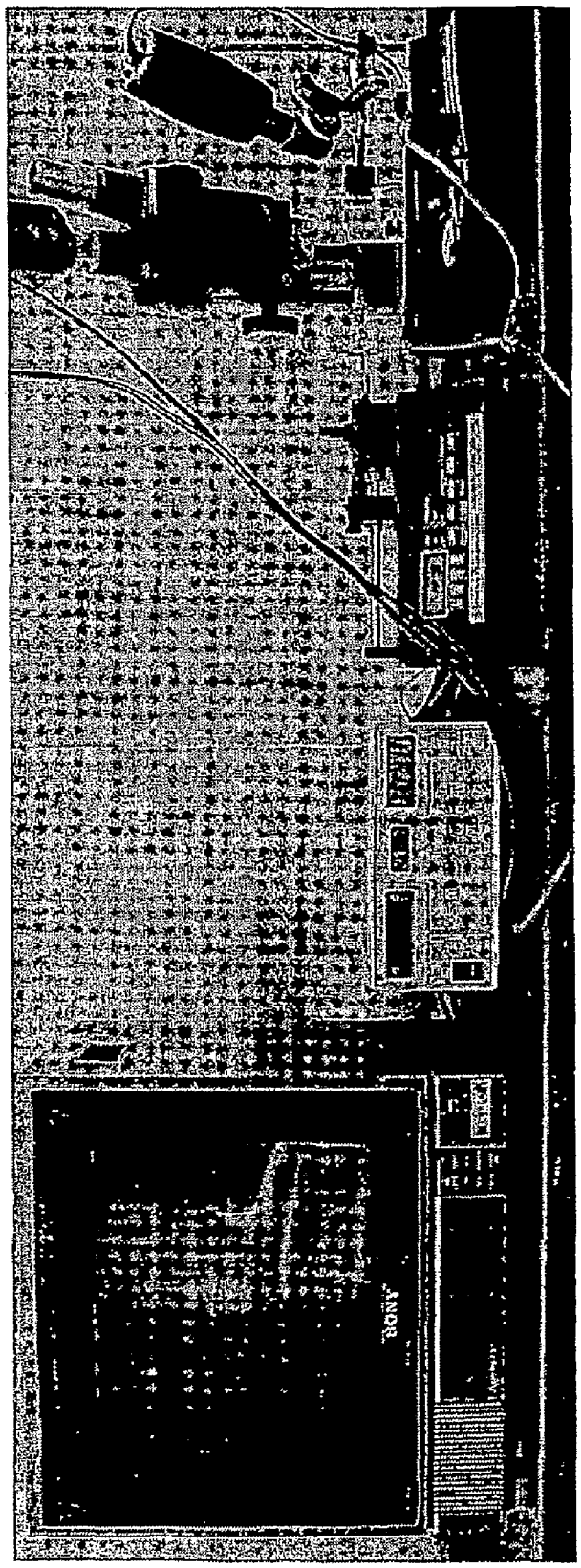
Fig. 13 is a picture of one possible lab setup to monitor the spray

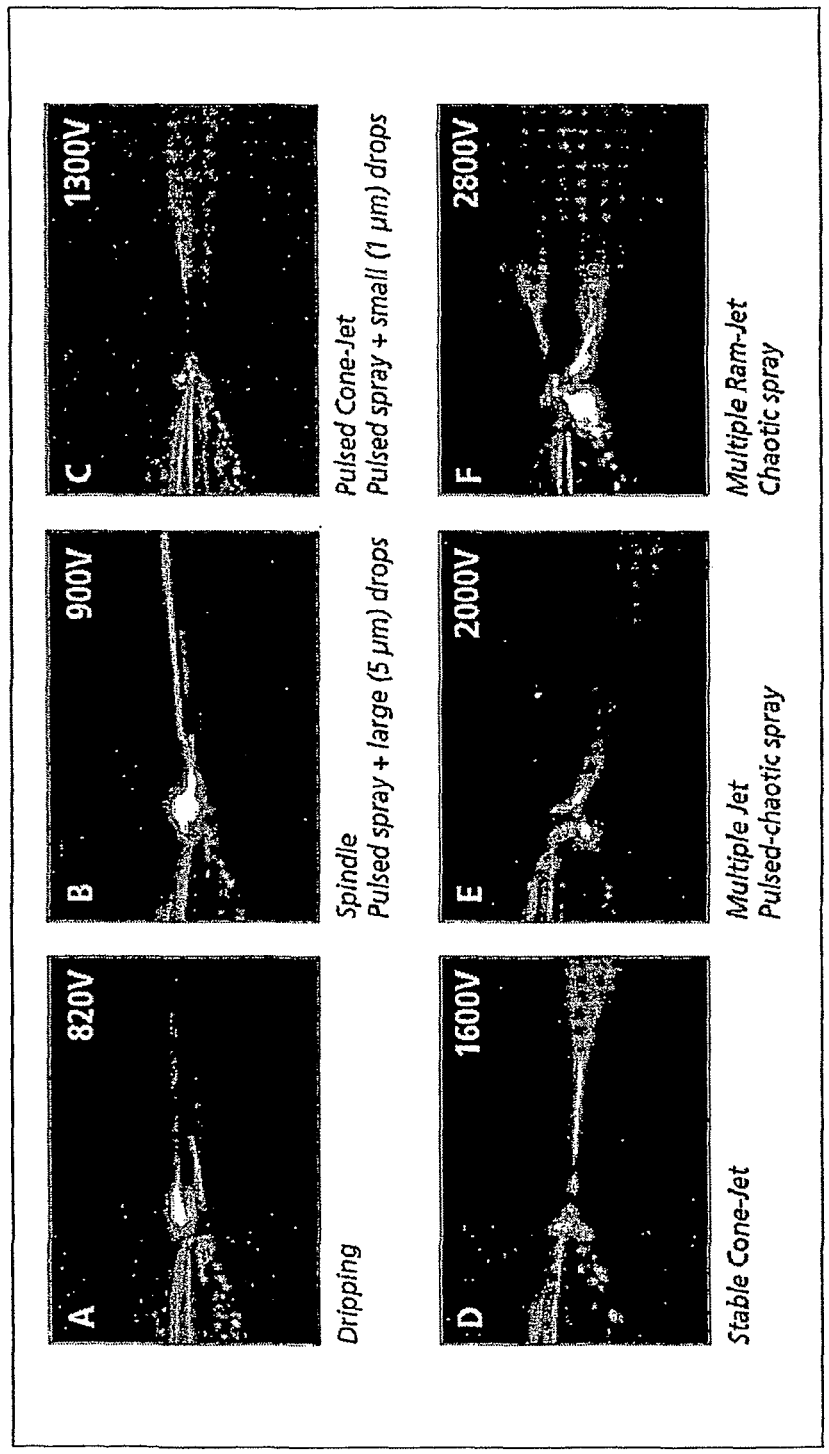
Fig. 14 illustrates different spray morphologies

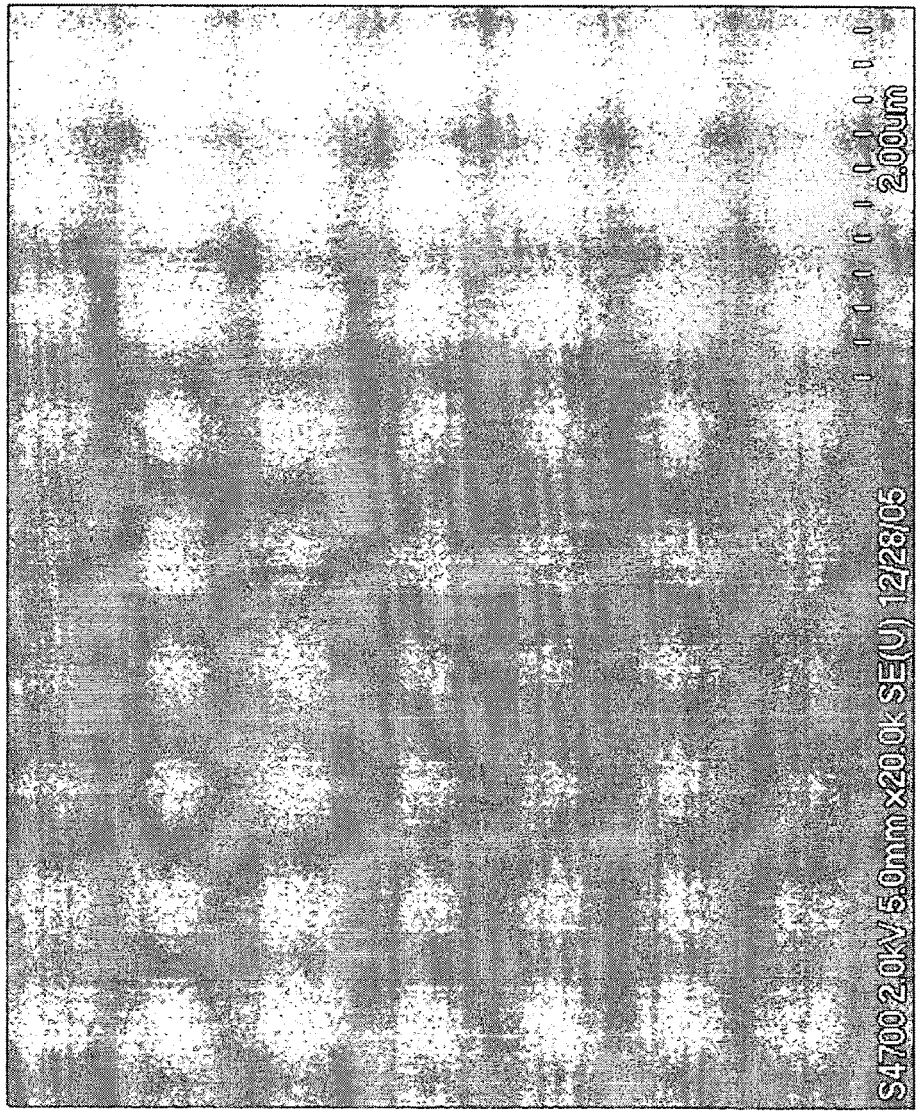
Fig. 15 is a SEM image of the spot size of 0.1M 18-crown-6 methanol on HF etched p-type silicon

ELECTROSPRAY DEPOSITION: DEVICES AND METHODS THEREOF

CROSS-REFERENCE TO RELATED APPLICATIONS

This application is the National Stage of International Application No. PCT/US2007/002280, filed Jan. 26, 2007, which claims the benefit of U.S. Provisional Application No. 60/762,613, filed Jan. 26, 2006, the disclosure of which is incorporated herein by reference in its entirety.

FIELD OF THE INVENTION

The present invention is in the field of electrospray deposition. The present invention is also in the field of processes for chemically depositing molecular ions on the micro- and nano-scale.

BACKGROUND OF THE INVENTION

Electrospray deposition is a well known method for transferring solutions into the gas phase. For example, electrospray is a practical method of ionizing samples for injection into a mass spectrometer. Electrospray-mass spectrometry has been applied to the mass analysis of high-molecular-weight compounds such as proteins, nucleotides and synthetic polymers in solution.

Electrospray can be accomplished by applying an electric field to the tip of a capillary containing an electrolyte solution at concentrations greater than about $10^{-6}$ mol/L. Under the influence of the electric field, a dipolar layer is formed at the meniscus of the solution at the capillary tip due to the partial spatial separation of the electrolyte ions. Such a dipolar layer destabilizes the meniscus and when the electric field is sufficiently high, it disperses the emerging solution into a very fine spray of charged droplets all at the same polarity. As the solvent evaporates away, the droplet size shrinks to further concentrate the droplet's charge while reducing its volume. Eventually, at the Rayleigh limit, coulombic repulsion overcomes the droplet's surface tension and the droplet explodes to form even smaller charged droplets. The process of solvent evaporation followed by coulombic explosion repeats until a mist of ion-molecules are formed. Such charged molecules may be deposited in various patterns using a mask.

Electrospray deposition of protein microarrays using a mask has been reported by Morozov and Morozova and Aveenko et al. Morozov and Morozova, *Anal. Chem.* 1999, 71, 1415-1420; Morozov and Morozova, *Anal. Chem.* 1999, 71, 3110-3117; Avseenko et al., *Anal. Chem.* 2001, 73, 6047-6052; Avseenko et al., *Anal. Chem.* 2002, 74, 927-933. In this paper, protein antigens were deposited as arrays of dry spots on an aluminized plastic surface in atmospheric condition using an electrospray technique. Dry protein spots were formed by shadow masking the ion beam through a mica sheet with array of holes (1.5 mm pitch, 30-60 um wide). A Japanese group has further defined a protein array using a photodefined fused silica as a shadow mask and a copper collimating electrode in conjunction with an electrospray deposition method. Lee et al., *J. of Chem. Eng. of Japan, Vol.* 36, No. 11, pp. 1370-1375, 2003.

SUMMARY OF THE INVENTION

Three features of electrospray set it apart from other chemical deposition methods. The first feature is the truly unique ability to produce individual ion-molecules. A second distinguishing feature of electrospray deposition is that samples under analysis must be introduced in solution. This attribute allows deposition of high-molecular-weight compounds. A third unique feature is the extreme "softness" of the electrospray process which permits the preservation in the gas phase of covalent bonding of the molecules as well as noncovalent interactions between molecules which existed in solution.

The present invention provides methods of depositing quasi molecular ions in a low pressure environment using electrospray where co-deposition can take place. The present invention also provides methods of controlling the quality and location of deposited quasi molecular ions produced by electrospray ionization. In certain embodiments of the invention, the ion beam is first detected by an ion detector for mass spectrometric analysis, followed by insertion of a substrate in front of the ion detector for ion deposition. Embodiments could also perform another mass spectrometric analysis of the molecular ions after the substrate is removed from the ion path.

The present invention also provides electrospray ionization methods for depositing, or "direct writing" of, molecular ions or quasi molecular ions on a substrate. Embodiments of these techniques control the spot size, shape and deflection of the ion beam by electric, magnetic, or a combination of electric and magnetic, fields.

Another aspect of the invention provides methods of depositing molecular ions by electrospray ionization techniques which allow for selection of a location, or locations, for deposit on a substrate by applying voltages of various magnitudes at different locations on the substrate. Selection of a location, or locations, for deposit can also be achieved using a floating potential.

The present invention provides methods for selectively depositing one or more ions onto, into, or both onto and into, at least one nanotube in an atmospheric or sub-atmospheric pressure environment using an electrospray ion source.

Other embodiments of the invention provide systems for selectively depositing ions on a substrate. The substrate can be comprised of one or more end-standing nanotubes linked to the substrate. This system comprises an electrospray ion source located within a vacuum chamber; a radiation or particle source located within a polymerization chamber; a substrate holder capable of transporting a substrate from the vacuum chamber to the polymerization chamber, the substrate comprising one or more end-standing nanotubes; and a controller capable of controlling the spatial orientation of the electrospray ion source relative to the substrate holder to give rise to ions exiting the electrospray ion source being selectively deposited into, onto, or both, at least a portion of the nanotubes.

The present invention also provides systems for selectively depositing one or more ions on a substrate, where the substrate comprises one or more end-standing nanotubes linked at one end to the substrate. One embodiment of the system comprises at least one electrospray ion source located within a chamber; at least one radiation source located within the chamber; at least one substrate holder capable of transporting a substrate comprising one or more end-standing nanotubes from a location proximate to at least one of the electrospray sources to a location proximate to the at least one radiation source; and a controller capable of controlling the spatial orientation of the electrospray ion source relative to the substrate holder to give rise to ions exiting the electrospray ion source being selectively deposited into, onto, or both, at least a portion of the nanotubes.

Methods for selectively depositing ions are also provided. These methods can comprise the steps of providing a nanotube assembly, wherein the nanotube assembly comprises one or more end-standing nanotubes linked at one end to a substrate in an atmospheric or sub-atmospheric pressure environment, and selectively depositing ions into one or more of the nanotubes in the assembly, onto one or more of the nanotubes in the assembly, or both, using an electrospray ion source.

The summary and the following detailed description are exemplary and explanatory only and are not restrictive of the invention, as defined in the appended claims. Other embodiments will be apparent to those skilled in the art in view of the detailed description of the illustrative embodiments, examples, and additional illustrative embodiments as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 1 is a schematic illustration of an embodiment of an ion source.

FIG. 2 is a schematic illustration of an embodiment of an ion source with a quadrupole filter, exit lens, and an ion detector.

FIG. 3 shows a schematic illustration of an embodiment of an ion beam direct write deposition system.

FIG. 4 shows an example of a gun/aperture alignment module for beam blanking.

FIG. 5 is a schematic of an embodiment of a collimator.

FIG. 6 is a cross-sectional diagram of an embodiment of a magnetic octupole used to correct astigmatism.

FIG. 7 is a schematic of an embodiment of an electrostatic objective lens.

FIG. 8 is a schematic of an embodiment of a electromagnetic objective lens.

FIG. 9 illustrates the concept of beam deflection using magnetic deflection and using electrostatic deflection.

FIG. 10 illustrates one example of an ion selective deposition method using a voltage scheme.

FIG. 11 shows a typical setup for electrospray.

FIG. 12 illustrates the production of the spray of ions at the tip of the needle.

FIG. 13 is a picture of one possible lab setup to monitor the spray.

FIG. 14 illustrates different spray morphologies.

FIG. 15 is a SEM image of the spot size of 0.1 M 18-crown-6 methanol on HF etched p-type silicon

DETAILED DESCRIPTION OF ILLUSTRATIVE EMBODIMENTS

The present invention adapts the electrospray method as a tool of chemical deposition. Disclosed are methods of using electrospray techniques for selective chemical deposition on surfaces, substrates, or micro- or nano-scale structures including nanotubes and arrays of nanotubes. These deposition techniques are useful to produce high resolution coatings, the doping of such coatings, the doping of micro- and nano-scale structures, or any combination of such coatings and doping. Also disclosed are apparatus and concomitant methodologies for patterning, or doping, IC circuit substrates with chemical coatings.

Electrospray is a method of generating a very fine liquid aerosol through electrostatic charging, rather than the more familiar gas (pneumatic) methods. In electrospray, a liquid is passed through a nozzle. The plume of droplets is generated by electrically charging the liquid to a very high voltage. The charged liquid in the nozzle becomes unstable as it is forced to hold more and more charge. Soon the liquid reaches a critical point, at which it can hold no more electrical charge. At the tip of the nozzle, the liquid blows apart into a cloud of tiny, highly charged droplets.

These tiny droplets are less than 10 µm in diameter and fly towards a potential surface to land on that is opposite in charge to their own. As they fly about, they rapidly shrink as solvent molecules evaporate from their surface. Since it is difficult for charge to evaporate, the distance between electrical charges in the droplet dramatically decreases. If the droplet can't find a home in which to dissipate its charge in time, the electrical charge reaches a critical state and the droplet will violently blow apart again.

When electrospray is used as a soft ionization method for chemical analysis, the more generally accepted term is "electrospray ionization" (ESI). Ionization is the process of generating a gas phase ion from a typically solid or liquid chemical species. It is called "soft" because the molecule being ionized does not fall apart or break-up during the process.

The most common electrospray apparatus employs a sharply pointed hollow metal tube, such as a syringe needle, with liquid pumped through the tube. A high-voltage power supply is connected to the outlet of the tube and the tube is positioned in front of a plate, called a counter-electrode, commonly held at ground potential.

When the power supply is turned on and adjusted for the proper voltage, the liquid being pumped through the tube transforms into a fine continuous mist of droplets that fly rapidly toward the counter-electrode.

At the tip of the cone, the liquid again changes shape into a fine jet. This jet however, then becomes unstable, breaking up into the mist of fine droplets. Since these droplets are all highly charged with the same electrical charge they repel each other very strongly. Thus the droplets fly apart from each other and cover a wide surface area.

As relayed in this disclosure, a stream of quasi molecular ions is generated by an electrospray source. In general, suitable ions and materials for electrospray are any that can be dissolved in a volatile solvent. Neutral molecules can be electrosprayed as easily as ions because charge can be introduced into the electrospray solution mix as supporting electrolyte. Thus the native charge, or lack of charge, of the molecules does not effect the production of ions appropriate for electrospray deposition Electrospray can be accomplished in a wide range of pressures, from atmospheric pressure to $10^{-10}$ Torr. In an atmospheric variation, the ion source consists of a nebulizing module and a voltage source. In the nebulizing module, the liquid sample is loaded in a syringe where its plunger is pushed by a syringe pump or a pneumatic pump. When the plunger is pushed forward, the ion stream is nebulized by an applied voltage at the conductive needle tip. The needle tip may be surrounded by a nebulizing gas (e.g., nitrogen) which keeps the nebulized molecules in a narrow stream.

In another variation, a sub-atmospheric ion source that has additional components such as a gate valve, a skimmer and vacuum stage, can be used. When the atmospheric ion beam enters the aperture of a gate valve to the vacuum chamber, the ion stream undergoes supersonic expansion when it enters the vacuum environment (from atmosphere). It passes through an interface gas curtain usually of nitrogen which prevents the sample and solvent from entering the vacuum chamber providing a dry region for declustering solvent molecules from the ions. A skimmer samples the supersonic jet in the silent zone next to the vacuum stage.

In one example, the coating materials that are vaporized in a vacuum chamber are ionized by electrical charge and propelled in an electric field to a substrate target. The trajectory of the ion particle beam is controlled by an electric field imposed on charged particles of finite mass, or an electrostatic lens. The trajectory of the ion particle beam can also be controlled by a magnetic field, or magnetic lens, or a combination of magnetic and electric fields. The charged particles can also be directed by deflectors or any combination of lenses (magnetic or electrostatic) and deflectors. Because the particle beam is charged, the target is electrostatically selective. These electrostatic forces are amplified in vacuum.

The amount of ions that are deposited by electrospray can be controlled by the amount of time the substrate is exposed to the ion stream. The deposition can also be controlled by the voltage applied or the rate the solution is pushed through the syringe. There are several parameters that affect the quality of the spray. These parameters are solvent, substrate type, substrate distance, onset voltage and flow rate. First a proper solvent needs to be identified. The solvent has to be highly evaporative and highly conductive. This is because the solvent type directly affects the required voltage to charge and break the droplets apart. For example, methanol would work well as a solvent. A mixture of methanol and HPLC grade water can also be used.

In certain embodiments, electrospray deposition can be used to form defined spots of dopant species on a conductive substrate. Sometimes an applied direct current gives rise to an electric field that may be high enough to break down the dielectric of the dopant species. This can be avoided, for example, by application of an alternating current.

Substrate distance affects the particle size formation. As distance increase, the time required to travel to the substrate increases and more of the solvent evaporates while transiting to the substrate reducing the size of the particles. As a side effect, there is also a drop in the electric field as distance increases. Fortunately the drop in voltage is minimal and can be easily compensated for by increasing the applied voltage. Care must be taken to not increase the electric field such that air ionization occurs. Onset voltage also affects the size of the particles formed.

One possible intended target of selective deposition of ions is a carbon nanotube (CNT). The nanotubes can be single-walled or multi-walled. A multiplicity of CNTs can also be doped or clad using this method. For example, the nanotubes could be attached to the substrate at one end. Further, these attached nanotubes could be oriented substantially perpendicular to the surface of the substrate. In addition, nanometer features within a carpet of CNTs or an island, or islands, of CNTs can also be targeted by the selective deposition of this method. It is envisioned that the technique can provide accurate deposition on the exterior and interior of carbon nanotubes or nanometer features of CNT arrays.

Various materials can be deposited using the disclosed electrospray deposition methods. Monomers, oligomers, and polymer materials can be deposited. Coating materials can include vinyl chloride, styrene, tetrafluroethylene, amino acids, nucleotides, ionophores, organometallic chelates, and other monomers. Biological materials such as proteins, oligonucleotides, antibodies, and antigens can be deposited. A variety of monomers, oligomers, polymers, and biological materials such as proteins, oligonucleotides, antibodies, and antigens that can also be used, as well as methods of using and applying them, are provided in copending U.S. provisional patent application, "CNT-Based Sensors: Devices, Processes, and Uses Thereof", by Salvatore Pace, application Ser. No. 60/762,788, filed Jan. 26, 2006, the entirety of which is incorporated by reference herein.

Methods of selective deposition using the electrospray techniques described herein are particularly applicable to micro- and nano-scaled substrates or features of substrates. For example, the possible dimensions of a CNT sensing element can ranges from 1 nm in diameter for single walled nanotubes (SWNTs) and a length of 10 nm to a diameter of 100 nm for multiwalled nanotubes (MWNTs) and a length greater than 1000 nm. Such dimensional resolution cannot be achieved by controlled deposition means using lithographic patterning procedures. To achieve this dimensional resolution, the coating material can [never say must] be reduced in mass to its lowest common mass denominator, the integral molecule. In the present invention that can be achieved using electrospray ionization.

The subject invention is non-restrictive as to the dopant composition, but is completely generic in its method of doping substrate surfaces with nanometer feature resolution. The only limitations to the dopant composition are the fragility of the molecule in intense electric fields and the effect of the shear stress imposed on the molecule during the vaporization process and upon impact with the substrate surface. Synthetic dopants such as ionophores, proteins and polymeric substances can be subjected to such force fields and electrical energy.

The methods of depositing quasi molecular ions of the present invention can be accomplished under a low pressure environment where other chemical processing might take place. For example, a substrate might be deposited with a polymer matrix under low pressure condition, then the same substrate might be transferred to the electrospray deposition chamber for ion-molecule deposition or 'doping', followed by another matrix deposition. Other scenarios might involve co-deposition of ion-molecules and other material.

In a typical electrospray deposition, nano-sized ion molecules are deposited on the substrate by applying sufficient potential between the electrospray ion source, the cathode, and the substrate, the anode. The present invention allows for methods of depositing ion molecules formed by electrospray ionization in a more precisely controlled manner on a selected location on a substrate. In one electrostatic embodiment, such selective deposition can be achieved by applying voltages of various magnitudes at different locations. FIG. 10 shows an example of such selective ion deposition on a substrate covered with an insulation layer. When a voltage (V-V1) is applied between the electrospray source and position 1, deposition occurs at position 1. On the other hand, when a voltage (V-V2) is applied between the electrospray source and position 2, deposition does not occur at position 2 because the electric field is not high enough to electrospray ionic solution. This can also be accomplished by letting the potential at position 2 vary, so that no electric field is established.

FIG. 1 is an example of a schematic description of an example of an ion source which can generate a stream of quasi molecular ions under a low pressure environment that is then deposited on a substrate. As shown in FIG. 1, a liquid sample is loaded in a syringe (1) where its plunger is pushed by a syringe pump. Surrounding the needle tip is the nebulizing gas tube (2) which keeps the droplets in a narrower beam. When the plunger is pushed forward, the ion stream is nebulized when a potential is applied at the conductive needle tip (3). The ion beam enters the aperture of a gas valve (5) to a vacuum chamber. The ion stream typically undergoes supersonic expansion when it enters from an atmospheric environment to the vacuum environment. It passes through an interface gas curtain (6) of nitrogen, which prevents the sample and solvent from entering the vacuum chamber and provides a dry region for declustering solvent molecules from the ions. A skimmer (4) samples the supersonic jet in the silent zone to next vacuum stage. This vacuum stage comprises AC entrance rods (7), cylindrical cryosurface (8), and transfer ion lenses (9). Voltages placed on the AC entrance rods and transfer ion lenses focus the sample ions into the quadrupole (10). The cryosurface removes the nitrogen quickly and efficiently as it condenses on the surface. The quasi molecular ion is then deposited on substrate (12).

The methods of the present invention provide a method of controlling the quality of deposited quasi molecular ions produced by electrospray ionization. An example of a quality control scheme is shown in FIG. 2, in which a quadrupole filter is placed after the transfer optics (9). The quadrupole filters the ions with desired mass/charge ratio with precise DC and RF potentials applied to the filter. An exit lens (11) helps to extract ions from the quadrupole filter. The ion beam can then be detected by the ion detector for mass spectrometric analysis. Then the substrate is inserted in front of the ion detector for ion deposition. As a final step, another mass spectrometric analysis of the molecular ion could be performed after the substrate is removed from the ion path. The mass spectrometer detector can also be used to measure the flux of the ion beam in order to determine the number of ions that are being deposited. Using this technique, the deposition layer thickness can be controlled by controlling the time exposure of the substrate.

In general, the methods of the present invention can include ion beam adjustment accomplished by a combination of beam alignment, beam shaping, beam focusing, and beam stigma adjustment. The aligned beam can then be deflected using a magnetic field to a specific location on a substrate where deposition takes place. Alternatively, ions can be selectively deposited using electrospray deposition on a substrate that has been masked with a shadow mask on the front surface of the substrate. It is also possible to direct ions generated by an electrospray ionization source to target locations on a substrate by applying a voltage to the selected deposition sites. This can also be accomplished by applying a voltage to target locations while other non-target sites are allowed to float. Deposition using this method could be applied as one method of coating or doping nanoscale electrodes or single nanotubes standing perpendicular to a substrate. For example, in a CNT array, some nanotubes could have a voltage applied while neighboring nanotubes did not. In this configuration, selective deposition could occur at selected nanotubes without affecting the remaining nanotubes in the array. The electrical conductivity of carbon nanotubes allows for this method of deposition. CNT arrays that are selectively doped or coated in this manner can be useful as chemical or biological sensors. A variety of selectively doped or coated CNT arrays and sensors are provided in copending U.S. provisional patent application, "CNT-Based Sensors: Devices, Processes, and Uses Thereof", by Salvatore Pace, application Ser. No. 60/762,788 filed Jan. 26, 2006, the entirety of which is incorporated by reference herein.

The methods of the present invention provide an electrospray ionization method for depositing, or "direct write" of, quasi molecular ions on a substrate, in which the spot size, shape and deflection of the ion beam can be controlled by electric fields, magnetic fields, or a combination of both. As shown in the figures, the ion beam can be focused and defined its spot size by applying electric field at the transfer and exit lens. Another set of lenses can be inserted along the ion path to define the shape of the beam. In addition, depending on the charges, the beam can be deflected under the influence of a magnetic field, which can be generated by a current flowing through a coil. By adjusting the intensity of the magnetic field, the magnitude of deflection varies, which allows the ion molecules to be precisely deposited on the desired location of the substrate. This "direct write" method could be used to deposit quasi molecular ions at desired locations on a substrate.

FIG. 3 shows a conceptual drawing of an ion beam direct write deposition system comprising an ion source, an ion optic column, a target substrate and a detector. The ion source is an electrospray nozzle that generates nano-sized charged ion molecules when high voltage is applied between the electrospray cathode and the aperture anode. In the ion column, ions are aligned, focused, shaped, and deflected in a point-by-point scan.

An embodiment of ion optic column features a gun/aperture alignment module, a collimator, a stigmator, an objective lens module, and a deflector. The purpose of the column is to generate a nano-sized ion beam which is focused, rotationally symmetric, and can be selectively deflected to a location on a target substrate.

As shown in FIG. 4, one embodiment of the gun/aperture alignment module consists of a parallel plate electrode and a single aperture electrode which is typically 10-50 um in diameter. The module aligns the ion beam to the aperture to maximize the beam current by controlling the voltage across the electrode. When the beam path scans over a substrate area that should not be deposited on, the module can blank the beam to avoid deposition. This can be achieved by applying an extreme voltage which causes the beam to deflect away from the aperture, which prevents the beam from passing through the aperture.

As shown in FIG. 5, one embodiment of the collimator can be a concentric shell made of iron with an internal concentric opening called a pole piece. Inside the iron shell is a core of copper windings. When current is applied to the coil, electromagnetic flux is formed inside the collimator. The flux will condense the incoming ion beam into a finer dimension along its optical axis. Collimation is a main factor determining beam resolution. The beam diameter as defined by the aperture anode, approximately 10-50 um, is condensed by the demagnification factor of the collimator.

In certain embodiments, due to the imperfection of the ion optic system in the x- and y-directions, the shape of the beam can be distorted causing astigmatism. Such astigmatism could be corrected by a stigmator using an electrostatic or magnetic octupole. One embodiment of a stigmator is shown in FIG. 6 as a magnetic octupole which aligns with the beam path axis concentrically. The beam can then be shaped to be rotationally symmetrical by controlling the polarity and strength of the magnetic octupole.

After the beam has been condensed, aligned, and shaped, it is ready to be focused. This can be accomplished by passing the beam through an objective lens module comprising electromagnetic lens and electrostatic lens. As shown in the example in FIG. 7, the electrostatic lens module can be a three concentric electrode system in which the incoming and exit electrodes are electrically grounded and the voltage is applied to the middle electrode. Such an electrode configuration forms an electric field which focuses the incoming ion beam to a focal point. Similar to the collimator, the electromagnetic lens, an example of which is shown in FIG. 8, converges the ion beam to a focal point.

In certain embodiments, in order for the beam to be written on a desirable location on the substrate, the ion beam has to pass through a deflection system which moves the ion beam in a point-by-point scan over the substrate. Two examples of embodiments of a deflection system are shown in FIG. 9. In the magnetic embodiment, the ion beam passes through quadruple coils residing along the ion path. By applying the current through two opposite coils, a magnetic field is generated across the ion path. According to Lorentz equation, i.e. $F=q(E+V\times B)$, E=electric field, V=velocity, B=magnetic field, the ion beam deflects to the third axis, in this case the Y-axis, which is perpendicular to the ion path, here the Z-axis, and the magnetic flux, the X-axis. The deflection of the ion beam depends on the mass of the ions, the magnetic field strength and the velocity of the ions. Similarly, in the electrostatic embodiment the ion beam passes through a quadruple electrode plate. An electric field will be generated by applying a voltage across the parallel plates, causing the ion beam be deflected in the direction of the electric field.

Finally, in some configurations, the ion beam location will be monitored. Thus after the beam is focused and positioned it will be either detected by a mass spectrometer detector in the calibration mode or deposited on a substrate during the deposition mode. In operation, the ion beam will be typically first calibrated by the detector, and then the target substrate will be inserted in front of the detector for ion deposition so that ion deposition can take place. Because the deflection of the ion beam is mass-specific, the ion beam needs to be calibrated for each individual ion source. Such calibration can be done by deflecting the ion beam to specific reference locations which have already been calibrated using a laser interferometer.

Controlled deposition of molecular ions using focused electrospray as described above can be accomplished on a micro- or nano-scale. Particular substrates that are envisioned are carbon nanotubes (CNTs), CNT arrays, CNT carpets, or CNT islands. Specifically, the deposition of ions on the outside wall of target nanotubes is envisioned. Also envisioned is the deposition of ions inside the nanotube. This method can be useful for selectively cladding or doping one or more nanotubes of CNT-based sensors. A variety of dopants and cladding materials that can be used, as well as methods of using and applying them, are provided in copending U.S. provisional patent application, "CNT-Based Sensors: Devices, Processes, and Uses Thereof", by Salvatore Pace, application Ser. No. 60/762,788 filed Jan. 26, 2006, the entirety of which is incorporated by reference herein.

Multiple layers of different ions can be deposited on the same substrate using the methods disclosed herein. For example, in a CNT array, a selection of nanotubes can be doped with one chosen ion in the first deposition step. In subsequent steps, additional, and perhaps different, nanotubes can be doped with a different molecular ion material. Alternatively, some nanotubes can have ions deposited on the exterior surface while, or subsequently, other nanotubes can have ions deposited on the interior surface. It is also possible to use the deposition methods presented in this application in sequence with or in conjunction with other thin film deposition methods to produce multiple layers of deposition.

A multistage deposition chamber is envisioned that would allow for the deposition of materials by electrospray in conjunction with one or more other processing or deposition steps. For example, a low pressure chamber that houses the electrospray deposition apparatus could be connected to a second chamber by an isolation valve. The second chamber could house another processing apparatus for thin film deposition, ablation, radiation treatment, or another processing step. Additional chambers could also be connected in series or parallel. The substrate could thus pass between the chambers for different stages of processing.

It is also possible to house the electrospray deposition apparatus in the same chamber as another processing step. For example, the substrate could be rotatably located in the chamber to different processing positions within the chamber. At each position a different molecular or quasi molecular ion could be deposited using the electrospray deposition methods of the invention or a separate processing step could be performed. These processing steps can include, but are not limited to, thin film deposition, ablation, radiation treatment, and polymerization treatments. A substrate could also linearly traverse the chamber. The system could be programmed to move the substrate via a controller to different positions in the chamber for various sequences of treatment. For example, the substrate holder could be moved by a controlled robot arm or linear transfer arm. In one embodiment, the substrate is positioned using an X, Y, and Z mechanical stage calibrated using a laser interferometer.

If a polymerizable material has been deposited, a polymerization step can be incorporated into the process. Likewise, a polymerization stage can be incorporated into the chamber as described above or an additional chamber that is separated by an isolation valve can be added to the apparatus. For example, the ions could be polymerized by irradiation with electromagnetic radiation or sub-atomic particles. Possible sources of electromagnetic radiation include infrared radiation, ultraviolet radiation, visible light, and gamma rays. Particles such as electrons, positrons, protons, anti-protons, neutrons, anti-neutrons, alpha particles, beta particles could be used. Preferred techniques are hot wire polymerization, plasma polymerization, and ultraviolet polymerization processes. For example, typical polymerization conditions using a plasma would include pressures in the range of about 1 to 1000 mTorr, with the power ranging up to 600 W. The plasma source could be an induced coupled plasma or generated using radio frequencies or microwaves.

An embodiment of a setup for electrospray is shown in FIG. 11. It is comprised of a syringe needle coupled to the positive terminal of a power supply. The negative power supply is coupled to the substrate. An example of an in lab setup is shown in FIG. 13. A video microscope can be used to monitor the quality of the spray.

To generate the initial spray, a low starting voltage, such as 0.9 kV, is recommended for certain embodiments. Because stable sprays often require higher applied voltages, the mobile phase may appear to pulsate or flicker upon exiting the tip. Slowly increasing the applied voltage by 0.1 kV increments and noting changes in spray morphology is the most effective technique to attain optimal spray quality. At very low voltages, a stream of large (ca 5 μm) droplets often appears as a thread which oscillates through the center of the plume. This behavior is characteristic of the spindle spray morphology (FIG. 14B). As the voltage is slowly increased, the average droplet size decreases to 1 μm, and the spindle disappears. The spray then assumes the pulsed cone jet mode in which a barely visible jet emanates from the emitter tip and forms a trapezoidal plume (FIG. 14C). Increasing the voltage to attain the ideal or stable cone jet morphology produces a clearly distinguishable Taylor Cone and single jet which fans into a round, slightly opaque spray plume (FIG. 14D). When voltage is further increased, the spray can fragment into one or more stable jets which channel the emission into multiple directions. This spray morphology is appropriately named the multi jet spray mode (FIG. 14E). At even higher voltages, the spray assumes a chaotic or ramified jet behavior where the jet undergoes dynamic changes in shape and branching. Multiple spray jets which form, disappear, and then reappear are not uncommon in this spray mode (FIG. 14F).

It has been found that flow rate has a direct bearing on the onset voltage. For a fixed onset voltage increasing the flow rate can cause multiple jets to be formed (FIG. 4E). Higher flow rates allows for more particle formation per unit time but at the cost of the size of the droplets. In general the flow rate is kept at a minimum usually between 1 µL/min to 3 µL/min. The flow rate is also limited by the type of needle used.

As one example, a SEM image of the spot size of 0.1M 18-crown-6 in methanol on HF etched p-type silicon as generated by electrospray deposition is shown in FIG. 15. To produce these deposits, the experimental conditions used were 1 µL/min for 60 s at 3.0 kV, with a substrate distance of 4 cm. The method is also applicable to insulating layers like silicon oxide on silicon wafers.

What is claimed:

1. A method for selectively depositing one or more ions, comprising:
   providing at least one nanotube in an atmospheric or sub-atmospheric pressure environment, and
   selectively depositing the one or more ions into at least one nanotube, onto at least one nanotube, or both, using an electrospray ion source.

2. The method of claim 1, wherein selectively depositing the one or more ions is controlled by an electric field, a magnetic field, deflectors or any combination thereof.

3. The method of claim 1, further comprising the step of: depositing a material onto the nanotube, into the nanotube, or both.

4. The method of claim 3, wherein the step of depositing the material occurs before, during, or after the step of selectively depositing the one or more ions.

5. The method of claim 3, wherein the material is co-deposited with the ions.

6. The method of claim 3, wherein the material comprises a monomer, oligomer, polymer, or any combination thereof.

7. The method of claim 6, further comprising forming the material into a polymer matrix.

8. The method of claim 1, wherein a plurality of polymerizable ions are selectively deposited on the nanotube and polymerized.

9. The method of claim 8, wherein the polymerization is accomplished via hot wire polymerization, plasma polymerization, or ultraviolet polymerization, or any combination thereof.

10. The method of claim 1, further comprising the step of: irradiating the nanotube, the one or more ions, or any combination thereof, with electromagnetic radiation, sub-atomic particles, or any combination thereof.

11. The method of claim 10, wherein the electromagnetic radiation includes infrared radiation, ultraviolet radiation, visible light, and gamma rays.

12. The method of claim 10, wherein the sub-atomic particles include electrons, positrons, protons, anti-protons, neutrons, anti-neutrons, alpha particles, beta particles, or any combination thereof.

13. The method of 10, wherein at least a portion of the ions are polymerized to form a polymer matrix.

14. The method of claim 1, wherein the nanotubes are arranged on a substrate in an array, a carpet, or combination thereof.

15. The method of claim 14, wherein the nanotubes are attached at one end to the substrate.

16. The method of claim 14, wherein the nanotubes are oriented substantially perpendicular to the surface of the substrate.

17. The method of claim 1, wherein the nanotubes comprise carbon nanotubes.

18. The method of claim 17, wherein the carbon nanotubes comprise single-wall carbon nanotubes, multi-wall carbon nanotubes, or any combination thereof.

19. A method for selectively depositing ions, comprising:
   providing a nanotube assembly, wherein the nanotube assembly comprises one or more end-standing nanotubes linked at one end to a substrate in an atmospheric or sub-atmospheric pressure environment, and
   selectively depositing ions into one or more of the nanotubes in the assembly, onto one or more of the nanotubes in the assembly, or both, using an electrospray ion source.

20. The method of claim 19, wherein selectively depositing the one or more ions is controlled by an electric field, a magnetic field, or any combination thereof.

21. The method of claim 19, further comprising the step of: depositing a material onto the nanotube, into the nanotube, or both.

22. The method of claim 21, wherein the step of depositing the material occurs before, during, or after the step of selectively depositing the one or more ions.

23. The method of claim 21, wherein the material is co-deposited with the ions.

24. The method of claim 21, wherein the material comprises a monomer, oligomer, polymer, or any combination thereof.

25. The method of claim 24, further comprising forming the material into a polymer matrix.

26. The method of claim 19, wherein a plurality of polymerizable ions are selectively deposited on the nanotube and polymerized.

27. The method of claim 19, further comprising the step of: irradiating the nanotube, the one or more ions, or any combination thereof, with electromagnetic radiation, sub-atomic particles, or any combination thereof.

28. The method of claim 27, wherein the electromagnetic radiation includes infrared radiation, ultraviolet radiation, visible light, and gamma rays.

29. The method of claim 27, wherein the sub-atomic particles include electrons, positrons, protons, anti-protons, neutrons, anti-neutrons, alpha particles, beta particles, or any combination thereof.

30. The method of claim 19, wherein the nanotube assembly comprises an array of nanotubes, a carpet of nanotubes, or combination thereof.

31. The method of claim 19, further comprising the step: depositing one or more ions on a surface portion of the substrate being interstitial to the end-linked nanotubes.

32. The method of claim 19, wherein the nanotubes comprise carbon nanotubes.

33. The method of claim 32, wherein the carbon nanotubes comprise single-wall carbon nanotubes, multi-wall carbon nanotubes, or any combination thereof.

34. A system for selectively depositing one or more ions on a substrate, the substrate comprising one or more end-standing nanotubes linked at one end to the substrate, the system comprising:

at least one electrospray ion source located within a chamber;

at least one radiation source located within the chamber;

at least one substrate holder capable of transporting a substrate comprising one or more end-standing nanotubes from a location proximate to at least one of the electrospray sources to a location proximate to the at least one radiation source; and a controller capable of controlling the spatial orientation of the electrospray ion source relative to the substrate holder to give rise to ions exiting the electrospray ion source being selectively deposited into, onto, or both, at least a portion of the nanotubes.

* * * * *